(12) United States Patent
Choi et al.

(10) Patent No.: US 8,040,036 B2
(45) Date of Patent: Oct. 18, 2011

(54) ORGANIC LIGHT EMITTING DEVICE AND METHOD FOR MANUFACTURING THE SAME

(75) Inventors: Hyeon Choi, Daejeon Metropolitan (KR); Se-Hwan Son, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 408 days.

(21) Appl. No.: 12/226,919

(22) PCT Filed: May 2, 2007

(86) PCT No.: PCT/KR2007/002158
§ 371 (c)(1),
(2), (4) Date: Oct. 31, 2008

(87) PCT Pub. No.: WO2007/129827
PCT Pub. Date: Nov. 15, 2007

(65) Prior Publication Data
US 2009/0079352 A1 Mar. 26, 2009

(30) Foreign Application Priority Data
May 4, 2006 (KR) .................. 10-2006-0040641

(51) Int. Cl.
*H01J 1/62* (2006.01)
*H01J 63/04* (2006.01)
*H01J 9/00* (2006.01)
*H05B 35/00* (2006.01)

(52) U.S. Cl. ........ 313/483; 313/498; 313/500; 313/501; 313/503; 313/504; 313/505; 313/506; 445/24; 315/185 R

(58) Field of Classification Search .................. None
See application file for complete search history.

(56) References Cited

U.S. PATENT DOCUMENTS

| | | | |
|---|---|---|---|
| 5,485,355 A * | 1/1996 | Voskoboinik et al. | 362/84 |
| 5,753,381 A * | 5/1998 | Feldman et al. | 428/696 |
| 6,074,071 A * | 6/2000 | Baumberg et al. | 362/101 |
| 6,538,375 B1 * | 3/2003 | Duggal et al. | 313/506 |
| 6,617,613 B2 | 9/2003 | Matsuo et al. | |
| 6,753,096 B2 * | 6/2004 | Duggal et al. | 428/690 |
| 6,855,027 B2 * | 2/2005 | Duggal et al. | 445/24 |
| 6,960,725 B2 * | 11/2005 | Zhengkai et al. | 174/102 R |
| 2003/0099858 A1 * | 5/2003 | Duggal et al. | 428/690 |
| 2005/0088087 A1 | 4/2005 | Ogawa | |

FOREIGN PATENT DOCUMENTS

| | | |
|---|---|---|
| JP | 2000-173771 | 6/2000 |
| JP | 2002-280163 | 9/2002 |
| JP | 2005-108643 | 4/2005 |

* cited by examiner

*Primary Examiner* — Natalie K Walford
(74) *Attorney, Agent, or Firm* — McKenna Long & Aldridge LLP

(57) ABSTRACT

Disclosed is an organic light emitting device and a method of manufacturing the same. The organic light emitting device includes a base rod, and a plurality of organic light emitting units. Each of the plurality of organic light emitting units includes a first electrode formed on the base rod, an organic layer formed on the first electrode, and a second electrode formed on the organic layer. The plurality of organic light emitting units are formed in longitudinal direction of the base rod and come into continuous contact with each other. The first electrode of each of the organic light emitting units comes into contact with the second electrode of each of the organic light emitting units adjoining said first electrode of each of the organic light emitting units.

11 Claims, 3 Drawing Sheets

[Fig. 1]
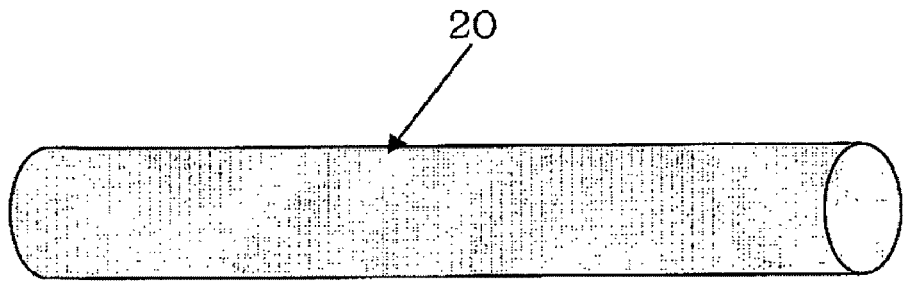
[Fig. 2]
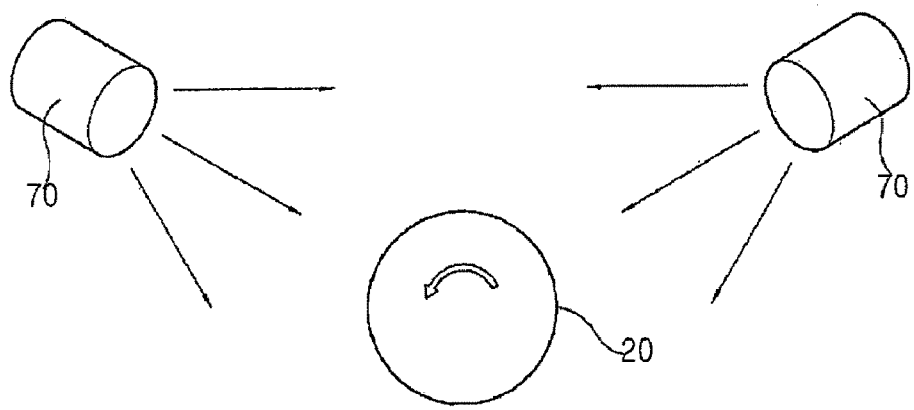
[Fig. 3]
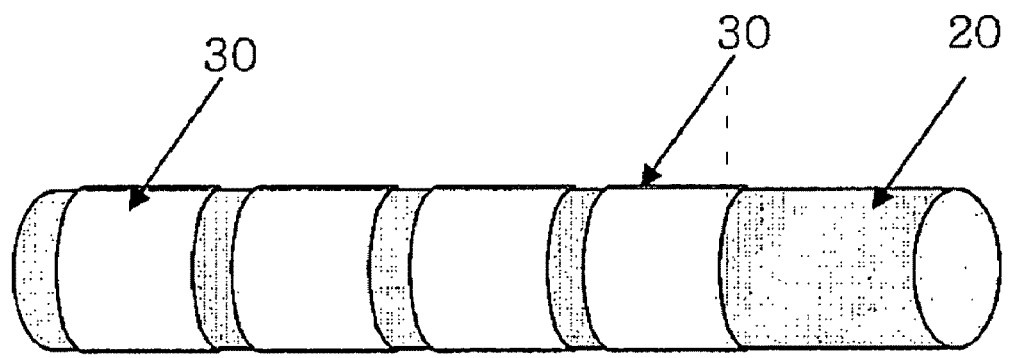

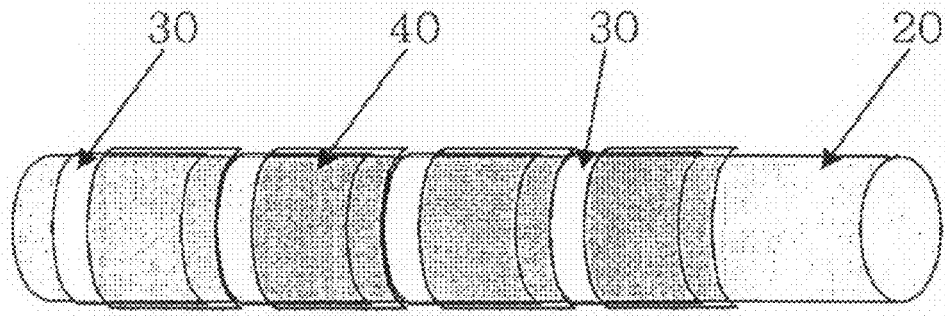
[Fig. 4]
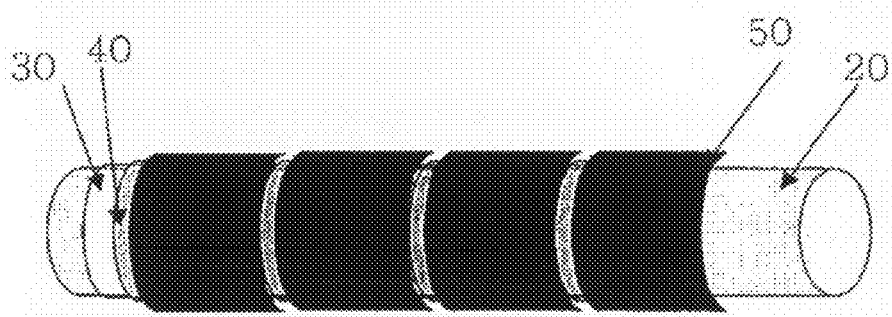
[Fig. 5]
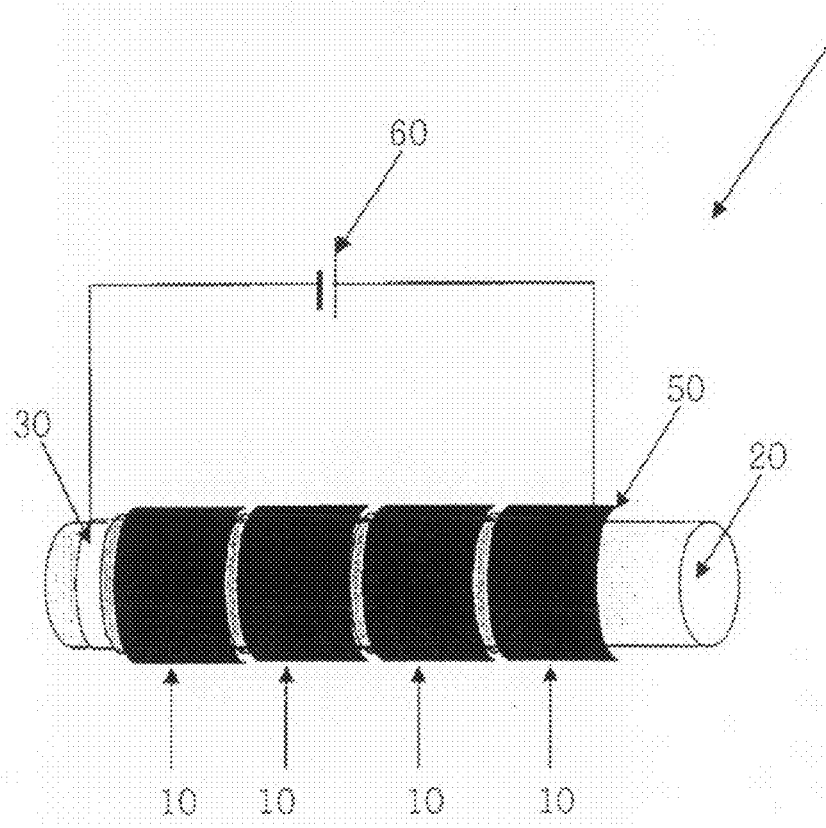
[Fig. 6]

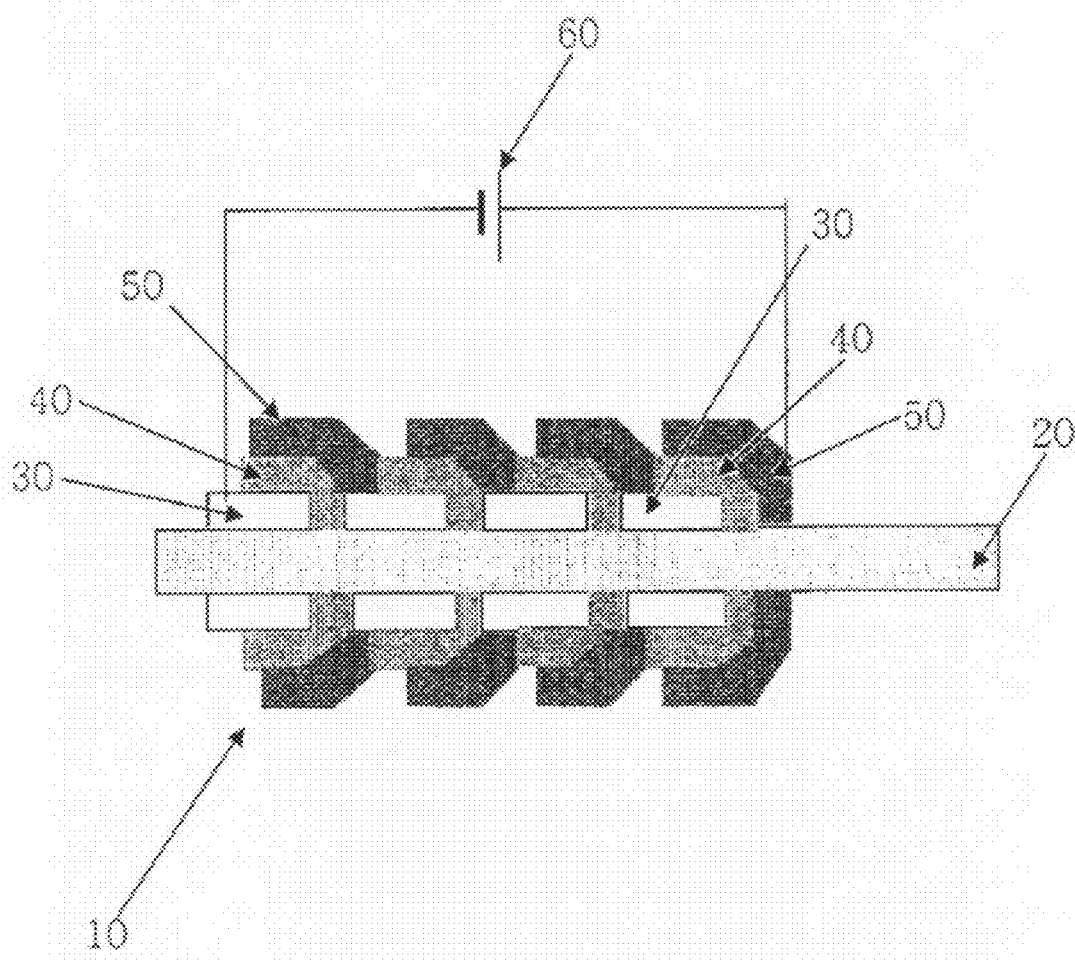

ORGANIC LIGHT EMITTING DEVICE AND METHOD FOR MANUFACTURING THE SAME

This application is a 371 national stage entry of International Application No. PCT/KR2007/002158, filed on May 2, 2007 that claims priority to Korea Patent Application No. 10-2006-0040641, filed on May 4, 2006, both of which are herby incorporated by reference in their entirety.

TECHNICAL FIELD

The present invention relates to an organic light emitting device which includes a plurality of organic light emitting units coming into continuous contact with each other on a base rod, and a method of manufacturing the same.

This application claims priority from Korean Patent Application No. 10-2006-0040641 filed on May 4, 2006 in the KIPO, the disclosure of which is incorporated herein by reference in its entirety.

BACKGROUND ART

An organic light emitting device using organic light emission is extensively applied to various types of lighting apparatuses because of an advantage of high brightness obtained using low voltage and also to display devices because of advantages of low voltage driving, light weight and slimness, a wide viewing angle, and a high-speed response.

The organic light emission means that electric energy is converted into light energy by using an organic substance. That is, in the case of when an organic layer is interposed between an anode and a cathode, if voltage is applied between two electrodes, holes are injected into the organic layer at the anode and electrons are injected into the organic layer at the cathode. When the injected holes and electrons meet each other, an exciton is formed. The exciton falls down to a bottom state to emit light.

For example, JP-A-2005-108643 discloses an organic light emitting device that includes a first electrode having a rod shape or a first electrode formed on a surface of a support rod, an organic layer formed on a surface of a first electrode, and a second electrode formed on a surface of the organic layer.

In connection with this, the first electrode is formed around the entire support rod, the organic layer is formed around the entire first electrode, and the second electrode is formed around the entire organic layer.

The organic light emitting device having the above-mentioned structure emits light by injection of a current, the first electrode is formed around the entire support rod, and the second electrode is formed around the entire support rod. That is, the first electrode and the second electrode are formed as a large unit cell around the support rod. Hence, there is a disadvantage in that the quantity of current injected per unit area is large.

In the case of when the first electrode and the second electrode are formed as a large unit cell around the support rod or the first electrode and the second electrode are connected in parallel, it is possible to perform low voltage driving in order to ensure required brightness. However, the quantity of current to be injected is increased. For example, in order to manufacture a device of 10 $\square$/W and ensure 1000 $\square$, power of 100 W is required. If driving is performed by using 5 V, a injection current of 20 A is required.

DISCLOSURE OF INVENTION

Technical Problem

It is an object of the present invention to provide an organic light emitting device in which a plurality of organic light emitting units is formed on a base rod to come into continuous contact with each other and be connected in series so that the organic light emitting device is capable of being connected to a power supply of high voltage and low current, and a method of manufacturing the same.

Technical Solution

In order to accomplish the above object, the present invention provides an organic light emitting device. The organic light emitting device includes a base rod, and a plurality of organic light emitting units. Each of the plurality of organic light emitting units includes a first electrode formed on the base rod, an organic layer formed on the first electrode, and a second electrode formed on the organic layer. The plurality of organic light emitting units are formed in longitudinal direction of the base rod and come into continuous contact with each other. The first electrode of each of other organic light emitting units comes into contact with the second electrode of each of the organic light emitting units adjoining said each of the organic light emitting units.

Furthermore, the present invention provides a method of manufacturing an organic light emitting device. The method includes (a) preparing a base rod; (b) forming a plurality of first electrodes on a circumferential surface of the base rod, in longitudinal direction of the base rod, at predetermined intervals; (c) forming a plurality of organic layers on a circumferential surface of the plurality of first electrodes, in longitudinal direction of the base rod, at predetermined intervals; and (d) forming a plurality of second electrodes on a circumferential surface of the plurality of organic layers, in longitudinal direction of the base rod, at predetermined intervals so that the second electrode of each of the organic light emitting units comes into contact with the first electrode of each of other organic light emitting units adjoining said each of the organic light emitting units in order to form a plurality of organic light emitting units including the first electrodes, the organic layers, and the second electrodes formed on the organic layers.

Advantageous Effects

According to the present invention, a plurality of organic light emitting units is connected to a single power supply in series. Therefore, light emission of a plurality of organic light emitting units may be realized by using the single power supply even though a plurality of organic light emitting units are not connected to the respective power supply. In addition, the organic light emitting device having high brightness may be provided while driving voltage is increased by multiplying in the number of organic light emitting units and the quantity of current to be injected is maintained at the level that is required in the single organic light emitting unit.

A base on which a plurality of organic light emitting units is formed has a rod shape, and the deposition area of the base having the rod shape may be three times larger than that of a base having a plate shape. Accordingly, the base rod may be applied to lighting apparatuses demanding high brightness per unit area to provide high brightness.

Furthermore, in a method of manufacturing the organic light emitting device according to the present invention, a plurality of first electrodes, a plurality of organic layers, and a plurality of second electrodes may be formed by using a deposition cell and a single shadow mask (not shown) while the base rod rotates. Accordingly, it is possible to simplify the process and reduce the manufacturing time, thereby manufacturing efficiency is improved.

BRIEF DESCRIPTION OF THE DRAWINGS

FIGS. 1 to 5 illustrate manufacturing of an organic light emitting device according to the present invention;

FIG. 6 illustrates connection of a power supply to the organic light emitting device of FIG. 5; and FIG. 7 is a sectional view of FIG. 6.

MODE FOR THE INVENTION

According to an embodiment of the present invention, an organic light emitting device includes a base rod and a plurality of organic light emitting units that is formed on the base rod to come into continuous contact with each other.

The base rod may be made of plastics or metal, and may or may not be hollow.

In the case of when the base rod is made of plastics, a first electrode may be directly formed on the plastic base rod or a metal reflection layer may be formed between the plastic base rod and the first electrode to perform reflection of light.

The metal reflection layer reflects light which travels from an organic layer to the plastic base rod so that light is emitted from the organic light emitting device to the outside. Thereby, emission efficiency of light may be improved.

In the case of when the base rod is made of metal, the base rod may be made of metal selected from gold, silver, aluminum, and an alloy thereof.

In the case of when the base rod is made of metal capable of providing high reflection, light that is emitted from the organic layer to the base rod is reflected by the metal base rod, so that light is efficiently emitted from the organic light emitting device to the outside.

Meanwhile, in the case of when a metal reflection layer is formed on a plastic base rod or in the case of when a metal base rod is used, a planarization layer may be further formed on the metal reflection layer or the metal base rod so as to allow the organic light emitting device to have predetermined planarization. Needless to say, the planarization layer may be directly formed on the plastic base rod while the metal reflection layer is not formed on the plastic base rod.

In this connection, the planarization layer may be made of one or more substances selected from a polyimide polymer, a photoacryl polymer, an overcoat material, BCB (benzocyclobutene), and SOG (spin-on-glass).

The organic light emitting unit includes a first electrode that is formed along the circumference of the outer surface of the base rod, an organic layer that is formed along the circumference of the outer surface of the first electrode, and a second electrode that is formed along the circumference of the outer surface of the organic layer.

A plurality of organic light emitting units are continuously connected on the base rod. That is, the units are connected in series. In this case, the first electrode of the organic light emitting unit comes into contact with the second electrode of the adjacent organic light emitting unit, and the contact structure is repeated.

Any one of the first electrode and the second electrode is an anode and the other is a cathode.

Any one of the first electrode and the second electrode may be made of transparent metal oxide such as indium tin oxide (ITO), indium zinc oxide (IZO), and zinc oxide (ZnO).

The other of the first electrode and the second electrode may be made of metal such as magnesium, calcium, sodium, potassium, titanium, indium, yttrium, lithium, gadolinium, aluminum, silver, tin, and lead, an alloy thereof, or a substance having a multilayered structure such as LiF/Al or LiO$_2$/Al.

Preferably, the first electrode is a cathode that is made of LiF/Al, the second electrode is an anode that is made of transparent indium tin oxide (ITO).

The organic layer may include a hole injecting layer, a hole transporting layer, a light emitting layer, and an electron transporting layer, but is not limited thereto.

If voltage is applied between the first and the second electrodes, a hole is injected into the organic layer at an anode and an electron is injected into the organic layer at a cathode. After the injected hole and electron are combined in the light emitting layer to be converted into an exciton, light is generated during deactivation of the exciton and visible rays including a white color are generated according to the type of light emitting layer.

Since a plurality of organic light emitting units come into continuous contact with each other, if voltage is applied, a plurality of organic light emitting units may emit light.

Particularly, if a plurality of organic light emitting units come into continuous contact with each other, when the first electrodes of the organic light emitting units come into contact with the second electrodes of the adjacent organic light emitting units, the second electrode of the first organic light emitting unit and the first electrode of the last organic light emitting unit are connected to a power supply so that a plurality of organic light emitting units emit light by using the single power supply.

In order to ensure light emission of the organic light emitting units, it is unnecessary to provide the power supply to every organic light emitting units, and a plurality of organic light emitting units, which are connected in series and to the single power supply, may emit light. Therefore, it is possible to produce an organic light emitting device having high brightness while driving voltage is increased by multiplying in the number of organic light emitting units and the amount of injected current is maintained to be similar to that of the single organic light emitting unit.

According to another embodiment of the present invention, a method of manufacturing an organic light emitting device includes (a) preparing a base rod; (b) forming a plurality of first electrodes on a circumferential surface of the base rod, in longitudinal direction of the base rod, at predetermined intervals; (c) forming a plurality of organic layers on a circumferential surface of the plurality of first electrodes, in longitudinal direction of the base rod, at predetermined intervals; and (d) forming a plurality of second electrodes on a circumferential surface of the plurality of organic layers, in longitudinal direction of the base rod, at predetermined intervals so that the second electrode of each of the organic light emitting units comes into contact with the first electrode of each of other organic light emitting units adjoining said each of the organic light emitting units in order to form a plurality of organic light emitting units including the first electrodes, the organic layers, and the second electrodes formed on the organic layers.

Therefore, a plurality of organic light emitting units each including the first electrode, the organic layer, and the second electrode is formed on the base rod.

In step b, a plurality of first electrodes is formed on the base rod while the base rod rotates by using one or more deposition cells and a cylindrical shadow mask provided on the base rod.

Any process may be used as a process of forming predetermined patterns on a base at regular intervals as long as the process is known in the art.

Next, in step c and step d, a plurality of organic layers and a plurality of second electrodes may be sequentially formed by using the same process.

That is, in the present invention, the single shadow mask is moved to a position to be patterned on the base rod, and a plurality of first electrodes, a plurality of organic layers, and a plurality of second electrodes are formed by using the deposition cell while the base rod rotates. Although the use of single shadow mask is described, two or more shadow masks may be used.

In the production process, since a deposition substance is deposited on the base rod, a deposition area may be three times larger than that of a base plate. Therefore, in the case of when the organic light emitting device produced according to the present invention is applied to a lighting apparatus demanding high brightness per unit area, high brightness may be provided.

In the above-mentioned production process, the description of the rotation of the base rod is given, but the production process may be performed while the base rod is fixed and the deposition cell rotates.

Furthermore, the number of deposition cells enough to be used during the production process is one or more, but three deposition cells may be provided so that the base rod is disposed at the center of a triangle of three deposition cells (see FIG. 2).

In the method of manufacturing the organic light emitting device according to the present invention, a plurality of first electrodes, a plurality of organic layers, and a plurality of second electrodes may be formed while the base rod rotates by using the deposition cell and the single shadow mask (not shown). Accordingly, the process is simplified and the production time is reduced, thereby improving productivity (see FIGS. 1 to 6).

Hereinafter, the present invention will be described in detail with reference to the accompanying drawings.

As shown in FIGS. 6 and 7, the organic light emitting device according to the present invention includes a base rod 20, and a plurality of organic light emitting units 10 that are formed on the base rod 20 to come into continuous contact with each other. Furthermore, a plurality of organic light emitting units 10 are connected to a power supply 60 in series.

The base rod 20 may be made of plastics or metal, and may or may not be hollow.

Each of the organic light emitting units 10 includes a first electrode 30 that is formed along the circumference of the outer surface of the base rod 20, an organic layer 40 that is formed along the circumference of the outer surface of the first electrode 30, and a second electrode 50 that is formed along the circumference of the outer surface of the organic layer 40.

Any one of the first electrode 30 and the second electrode 50 is an anode and another is a cathode.

In connection with this, preferably, the first electrode 30 is the cathode that is made of LiF/Al and the second electrode 50 is the anode that is made of transparent indium tin oxide (ITO).

Although not shown in FIGS. 6 and 7, the organic layer 30 may include a hole injecting layer, a hole transporting layer, a light emitting layer, and an electron transporting layer. Therefore, if voltage is applied between the first and the second electrodes 30 and 50, the hole is injected into the organic layer at the anode and the electron is injected into the organic layer at the cathode. After the injected hole and electron are combined with each other in the light emitting layer to form an exciton, light is emitted during deactivation of the exciton and visible rays including a white color are generated according to the type of light emitting layer.

The method of manufacturing an organic light emitting device 1 that includes the organic light emitting unit 10 having the above-mentioned configuration will be described with reference to FIGS. 1 to 5.

A plurality of first electrodes 30 is formed as shown in FIG. 3 while the base rod 20 of FIG. 1 rotates clockwise as shown in FIG. 2 by using three deposition cells 70 which are disposed in a triangle form and the cylindrical shadow mask provided on the base rod 20. Through the same procedure, a plurality of organic layers 40 is formed on a plurality of first electrodes 30 as shown in FIG. 4, and a plurality of second electrodes 50 is formed on a plurality of organic layers 40 as shown in FIG. 5. Accordingly, as shown in FIGS. 6 and 7, a plurality of organic light emitting units 10 are longitudinally formed on the base rod 20 to come into continuous contact with each other.

As shown in FIGS. 6 and 7, a plurality of organic light emitting units 10 that are produced by using the above-mentioned method come into continuous contact with each other on the base rod 20. In this case, the first electrodes 30 of the organic light emitting units 10 come into contact with the second electrodes 50 of the adjacent organic light emitting units 10, and the contact structure is repeated.

In the organic light emitting device 1 that includes a plurality of organic light emitting units 10 coming into continuous contact with each other on the base rod 20 according to the present invention, based on the state shown in FIGS. 6 and 7, if the second electrode 50 of the rightmost organic light emitting unit 10 and the first electrode 30 of the leftmost organic light emitting unit 10 are connected to the single power supply 60, since a plurality of organic light emitting units 10 are connected in series, it is possible to emit light from all the organic light emitting units 10 by using the single power supply 60.

The invention claimed is:

1. An organic light emitting device comprising:
a base rod; and
a plurality of organic light emitting units,
wherein each of the plurality of organic light emitting units includes a first electrode formed on the base rod, an organic layer formed on the first electrode, and a second electrode formed on the organic layer,
the plurality of organic light emitting units are formed in longitudinal direction of the base rod and come into continuous contact with each other, and
the first electrode of each of the organic light emitting units comes into contact with the second electrode of each adjacent organic light emitting unit.

2. The organic light emitting device according to claim 1, wherein the second electrode of the organic light emitting unit which is provided at one end of the base rod among the plurality of organic light emitting units which are disposed in longitudinal direction of the base rod and the first electrode of the organic light emitting unit which is provided at the other end of the base rod are connected to a power supply, so that the plurality of organic light emitting units are connected to the power supply in series.

3. The organic light emitting device according to claim 1, wherein the base rod is made of a plastic.

4. The organic light emitting device according to claim 1, wherein the base rod is made of a substance selected from gold, silver, aluminum, and an alloy thereof.

5. The organic light emitting device according to claim 1, further comprising a planarization layer that is formed between the base rod and the first electrode of the plurality of organic light emitting units.

6. The organic light emitting device according to claim 5, wherein the planarization layer is made of one or more substances selected from a polyimide polymer, a photoacryl polymer, an overcoat material, BCB (benzocyclobutene), and SOG (spin-on-glass).

7. A method of manufacturing an organic light emitting device, comprising the steps of: (a) preparing a base rod; (b) forming a plurality of first electrodes on a circumferential surface of the base rod, in longitudinal direction of the base rod, at predetermined intervals; (c) forming a plurality of organic layers on a circumferential surface of the plurality of first electrodes, in longitudinal direction of the base rod, at predetermined intervals; and (d) forming a plurality of second electrodes on a circumferential surface of the plurality of organic layers, in longitudinal direction of the base rod, at predetermined intervals so that the second electrode of each of the organic light emitting units comes into contact with the first electrode adjacent organic light emitting unit in order to form a plurality of organic light emitting units including the first electrodes, the organic layers, and the second electrodes formed on the organic layers.

8. The method according to claim 7, wherein the base rod rotates in steps b to d.

9. The method according to claim 7, wherein a cylindrical shadow mask is used in steps b to d.

10. The method according to claim 7, wherein one or more deposition cells are used in steps b to d.

11. The method according to claim 10, wherein the three deposition cells are used in steps b to d and are disposed in a triangle form while the base rod is disposed at the center of the triangle.

* * * * *